(12) United States Patent
Jonsson

(10) Patent No.: US 6,486,807 B2
(45) Date of Patent: Nov. 26, 2002

(54) A/D CONVERTER CALIBRATION

(75) Inventor: Bengt Erik Jonsson, Spånga (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 40 days.

(21) Appl. No.: 09/842,390

(22) Filed: Apr. 25, 2001

(65) Prior Publication Data

US 2002/0014982 A1 Feb. 7, 2002

(30) Foreign Application Priority Data

Apr. 25, 2000 (SE) .............................. 0001486

(51) Int. Cl.$^7$ ................................................ H03M 1/06
(52) U.S. Cl. ...................................... 341/120; 341/155
(58) Field of Search ............................... 341/120, 118, 341/119, 135, 121

(56) References Cited

U.S. PATENT DOCUMENTS

| | | | |
|---|---|---|---|
| 4,315,254 A | | 2/1982 | Honjyo et al. |
| 4,835,535 A | | 5/1989 | Shibayama et al. |
| 5,196,851 A | | 3/1993 | Patel et al. |
| 5,331,321 A | | 7/1994 | Mannonen |
| 5,361,067 A | | 11/1994 | Pinckley |
| 5,499,027 A | | 3/1996 | Karanicolas et al. |
| 5,594,612 A | | 1/1997 | Henrion |
| 5,666,118 A | | 9/1997 | Gersbach |
| 5,870,041 A | | 2/1999 | Lee et al. |
| 6,407,685 B1 | * | 7/2002 | Handel ........................ 341/120 |

FOREIGN PATENT DOCUMENTS

| | | |
|---|---|---|
| EP | 0 460 840 A2 | 12/1991 |
| EP | 0 889 596 A2 | 1/1999 |
| EP | 0 930 715 A2 | 7/1999 |
| WO | 94/27373 | 11/1994 |
| WO | 96/15593 | 5/1996 |
| WO | 99/34516 | 7/1999 |

OTHER PUBLICATIONS

S.H. Lewis and P.R. Gray, "A Pipelined 5–Msample/s 9–bit Analog–to–Digital Converter", IEEE J. Solid–State Circ., pp. 954–961, vol. SC–22, No. 6, IEEE Inc., Dec. 1987.
C.S.G. Conroy, D.W. Cline, and P.R. Gray, "An 8–b 85–MS/s ParallePipeline A/D Converter in 1–μn CMOS", IEEE J. Solid–State Circ., pp. 447–454, vol. 28, No. 4, IEEE Inc., Apr. 1993.
I. Galton and P. Carbone, "A Rigorous Error Analysis of D/A Conversion with Dynamic Element Matching", IEEE Trans. Circ. Syst.–11, pp. 763–772, vol. 42, No. 12, IEEE Inc., Dec. 1995.
I. Galton, "Spectral Shaping of Circuit Errors in Digital–to–Analog Converters", IEEE Trans. Circ. Syst.–II, pp. 808–817, vol. 44, No. 10, IEEE Inc., Oct. 1997.
H.–S. Lee and D. Hodges, "Self–Calibration Technique for A/D Converters", IEEE Trans. Circ. Syst., pp. 188–190, vol. CAS–30, No. 3, IEEE Inc., Mar. 1983.
J. Goes, J.C. Vital, and J.E. Franca, "A CMOS 4–bit MDAC with Self–Calibrated 14–bit Linearity for High–Resolution Pipelined A/D Converters", 1996 Custom Integrated Circ. Conf., pp. 105–108, IEEE.
E. G. Soenen and R.L. Geiger, "An Architecture and an Algorithm for Fully Digital Correction of Monolithic Pipelined ADC's", IEEE Trans. Circ. Syst.–II, pp. 143–153, vol. 42, No. 3, Mar. 1995, IEEE.

* cited by examiner

*Primary Examiner*—Brian Young

(57) ABSTRACT

A pipeline stage in a multi-bit/stage pipeline A/D converter is calibrated by switching a set of D/A converter unit-segments in the stage to predetermined states to produce a first digital signal. A second digital signal is produced by switching a predetermined unit-segment in the set to its complementary state and keeping the states of the other unit-segments in the set unchanged. The unit-segment is then associated with a calibration coefficient representing the deviation of the difference between the first and second digital signals from an expected difference between the first and second digital signals. This process is repeated for each unit-segment that is to be calibrated.

14 Claims, 7 Drawing Sheets

Fig. 3

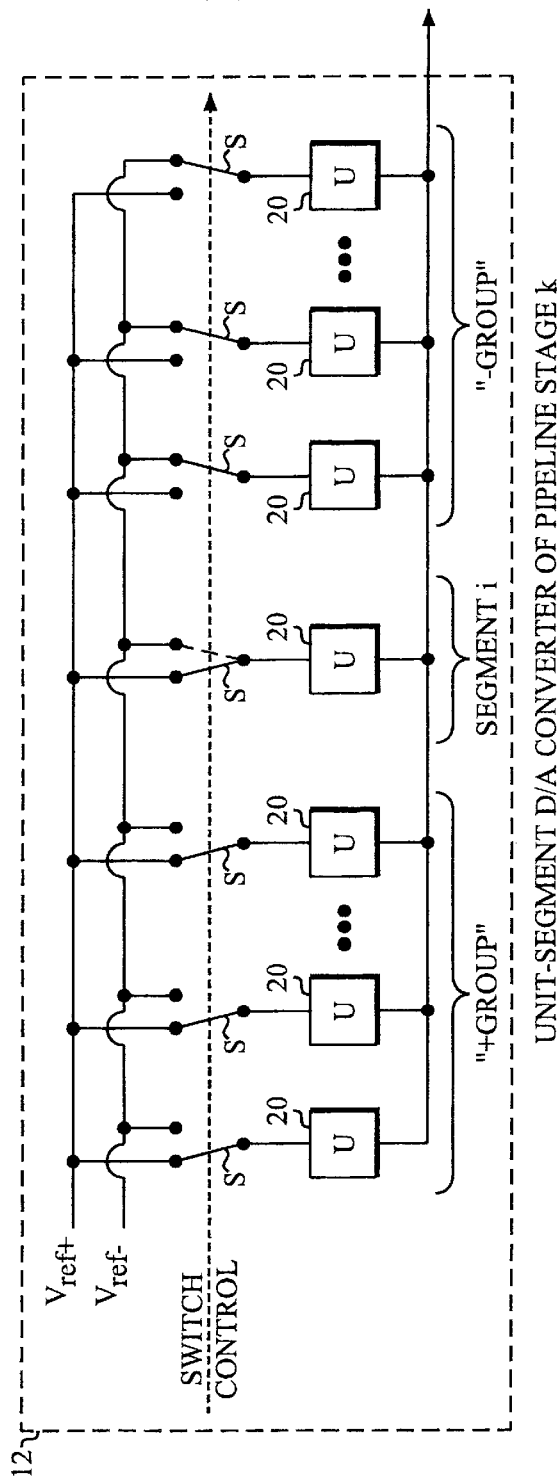
Fig. 5
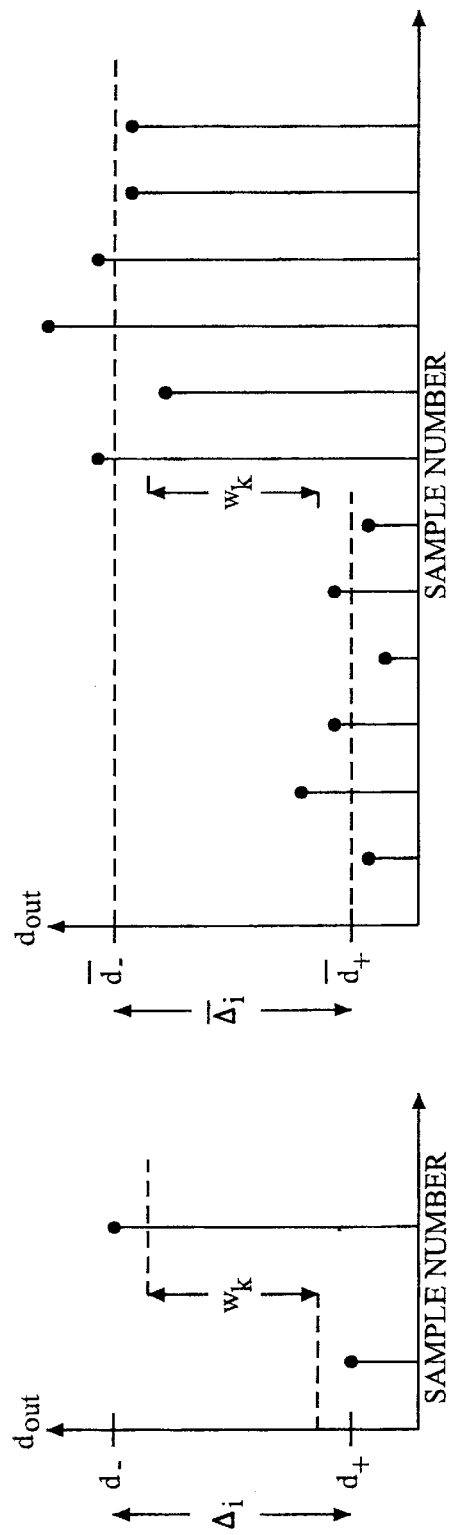
Fig. 7
Fig. 6

A/D CONVERTER CALIBRATION

BACKGROUND

The present invention relates to A/D converters (analog-to-digital converters), and in particular to calibration of a pipeline stage in a multi-bit/stage pipeline A/D converter.

The maximum achievable accuracy-speed performance of any A/D-converter is limited by non-ideal effects associated with its building blocks. Typically, the performance is limited by settling time, finite amplifier gain and/or analog component mismatch. When designing high-speed, high-accuracy A/D converters, these limitations impose very stringent demands on the building blocks, leading to prolonged design time. They also require the use of manufacturing processes that are optimized for component matching, thus increasing the manufacturing cost. This is the motivation for finding A/D converter architectures that will relax such design-requirements.

The influence of component mismatch can be reduced in several ways. Examples of prior art solutions are given below. References [1]–[2] disclose pipeline A/D converter algorithms that automatically correct erroneous bit-level decisions caused by component mismatch. This helps to reduce the requirements on the components that are involved in the bit-level decisions, i.e., the comparator and reference circuit. This technique is often called digital correction. However, such digital correction methods for pipeline A/D converters are limited in that they only compensate for errors in the sub A/D converters (internal low-resolution A/D converters) but not for errors in the multiplying D/A converters (internal low-resolution D/A converters). Reference [3] suggests random selection of components. This transforms the error into noise, so that the components match perfectly "in average". This technique is also called dynamic element matching or scrambling. Dynamic element matching does not actually reduce the error energy, it is just spread out over the entire frequency spectrum. This helps to improve the SFDR (Spurious-Free Dynamic Range), but the SINAD (SIgnal-to-Noise-And-Distortion ratio) is unaltered, and therefore the effective resolution of the A/D converter is not improved. Only if the signal band of interest is less than the Nyquist band, can the in-band SINAD be improved by spectral shaping of the random signal, see [4].

Another prior art technique to reduce component mismatch is trimming of on-chip components. Each critical analog component is trimmed to improve matching beyond the tolerances of the manufacturing process, e.g. as disclosed in [5]. However, trimming is a costly extra manufacturing step. Furthermore, trimming is only performed at one specific operating condition that has to cover all future conditions.

A further prior art technique to reduce the impact of component mismatch on performance is some form of calibration in the analog or digital domain. Generally, a calibration algorithm first acquires information representing the imperfections of the circuit, and then subtracts the estimated error, either in the analog [6]–[7] or the digital domain [8]. Generally, calibration methods that subtract errors in the analog domain have to rely again on analog component matching, and are therefore likely to be sub-optimal. Calibration methods that subtract errors in the digital domain do not suffer from such limitations.

Several digital domain calibration methods have been proposed.

One approach is to have a very pure or otherwise known reference input signal, analyze the distortion from the conversion process, and then correct the transfer function of the A/D converter [9]–[10].

Another digital calibration method is to use a "golden" A/D converter or D/A converter as a high-precision reference, then compare the imperfect A/D converter output at a certain code with the "golden" value and establish the difference as a code-dependent error to be corrected. This is the approach in [11]–[12]. While potentially giving good results, using a "golden" reference is not desirable in many situations. Clearly it is preferable that the A/D converter can calibrate itself without the need for external or internal high-precision references.

Examples of digital calibration for 1-bit/stage and 1.5-bit/stage pipeline A/D converters are also found in [13]–[14] and [15]–[17], respectively, and for multi-bit/stage A/D converters in [18]–[19]. Common to all of these converters is that the internal D/A converter is forced through a calibration sequence, and the resulting analog output is digitized and processed to extract information about the conversion error.

The solutions proposed for 1 bit and 1.5 bit/stage pipeline A/D converters are, however, not suitable for calibration of multi-bit/stage architectures.

The multi-bit/stage solutions use code-related calibration, which means that the calibration coefficient is associated with the occurrence of a certain code. This leads to several drawbacks:

The calibration coefficient is associated with each code of the first, or first few, internal D/A converters, thus correcting for the sum of unit-segment errors associated with each code. However, even after calibration there will be a residual error that was not removed by the calibration. Due to drift, there will also be small changes in how effective the calibration is. All of this will lead to incomplete removal of the harmonic distortion. This residual distortion could be removed by applying dynamic element matching (random selection of which m unit-segments are used to represent a code m). There are, however, a large number of valid ways to select m unit-segments out of n, especially in the middle of the code range. The code-related calibration coefficients in the prior art cover only one pre-determined set of m unit-segments representing code m, and can therefore not be used together with dynamic element matching or any other form of random or deterministic scrambling of the D/A converter unit-segments.

Furthermore, in prior art multi-bit/stage pipeline A/D converters the D/A converter is switched through its range of codes starting either from one end or the other [18], or from the middle of the code-range [19]. The error for each unit-segment is then identified as the error in the incremental output change between two adjacent D/A converter codes. Due to the inter-stage gain, the analog output would for most codes be well out of range for the remaining pipeline stages unless an appropriate input value is sampled as well. The sampling of such an input signal introduces a code-dependent charge feed-through error in SC (Switched Capacitor) implementations, and should be avoided.

Another drawback in prior art multi-bit/stage pipeline A/D converters is that the calibration coefficients for each code are calculated by accumulating the estimated unit-segment errors measured up to that code, see [18]–[19]. However, this implies that the estimation errors for each unit-segment are accumulated as well, which leads to different precision in the estimation of the first and last coefficients.

SUMMARY

It is an object of the present invention to accurately detect and compensate for circuit imperfections in A/D converters using hardware that is itself subject to the same, or equivalent, imperfections. More specifically, the invention is concerned with the problem of extracting and using such information for calibration of multi-bit/stage pipeline A/D converters without hindering the use of further performance enhancement techniques, such as dynamic element matching.

This object is achieved in accordance with the attached claims.

Briefly, the present invention calibrates a pipeline stage by switching a unit-segment in the D/A converter of the pipeline stage between its two complementary states and calculating the difference between the resulting digital signals produced by the A/D converter. In this switching process the remaining unit-segments of the pipeline stage are kept in fixed states. The obtained difference signal is compared to the difference signal that is to be expected if the components were ideal. The deviation between the actual and expected difference signal is stored as a calibration coefficient for the selected unit-segment. This procedure is repeated for the other unit-segments of the pipeline stage. Other pipeline stages are calibrated in the same way. A major advantage of this method is that the calibration is code independent, since calibration is performed on unit-segment level. This means that the calibration may be combined with performance enhancement techniques, such as dynamic element matching or scrambling.

BRIEF DESCRIPTION OF THE DRAWINGS

The invention, together with further objects and advantages thereof, may best be understood by making reference to the following description taken together with the accompanying drawings, in which:

FIG. 5 is a block diagram of a generic unit-segment D/A converter during calibration in accordance with the present invention;

FIG. 6 is a diagram illustrating calibration of a unit-segment;

FIG. 7 is a diagram illustrating averaging in connection with calibration of a unit-segment;

DETAILED DESCRIPTION

In the following description the same reference designations will be used for the same or similar elements.

Figure 1:
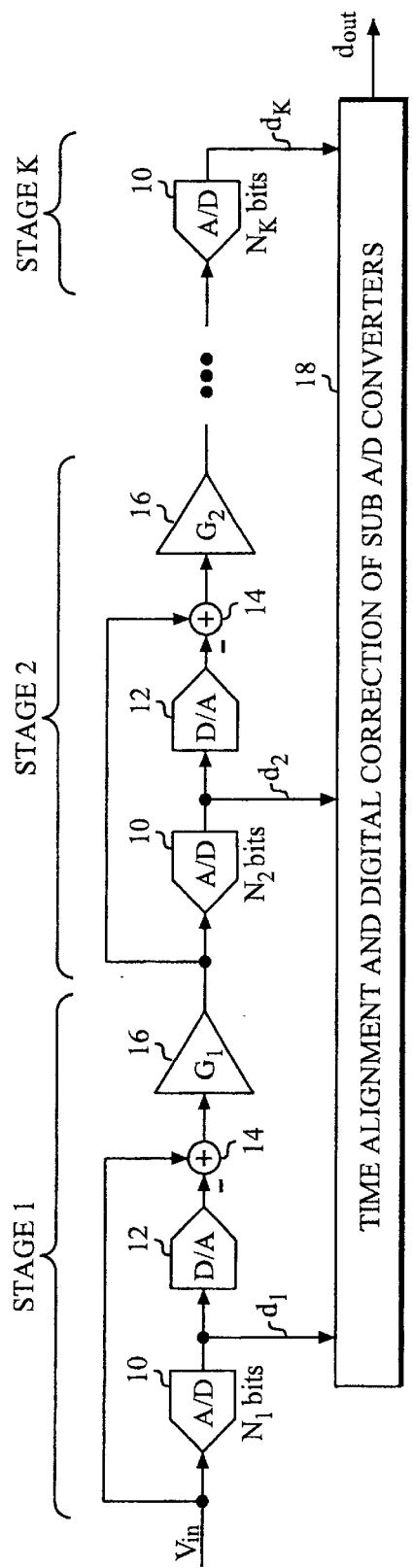
FIG. 1 is a block diagram of a typical pipeline A/D converter.

FIG. 1 is a block diagram of a typical pipeline A/D converter. An N-bit analog-to-digital conversion is performed in two or more stages, each stage extracting $\{N_1, N_2 \ldots N_K\}$ bits of information represented by the digital words $\{d_1, d_2 \ldots d_K\}$, where K is the number of pipeline stages. The first pipeline stage extracts the $N_1$ most significant bits using an $N_1$-bit A/D converter 10, also called a sub A/D converter. Then the estimated value is subtracted from the analog input signal $V_{in}$ by using a D/A-converter 12 and an adder 14, leaving a residue containing the information necessary to extract less significant bits. Usually the residue is amplified by an amplifier 16 having a gain $G_1$ to establish the appropriate signal range for stage 2. These steps are repeated for all K stages, with the exception of the last pipeline stage, which does not need to produce an analog output and therefore has no D/A converter, adder or amplifier, but only an A/D converter 10. The digital words $\{d_1, d_2 \ldots d_K\}$ are then combined to form the digital output word $d_{out}$ in a unit 18 for time alignment and digital correction of sub A/D converters. This digital correction is performed in addition to the calibration described below. An example of an embodiment where this digital correction is possible is described in [1].

Figure 2:
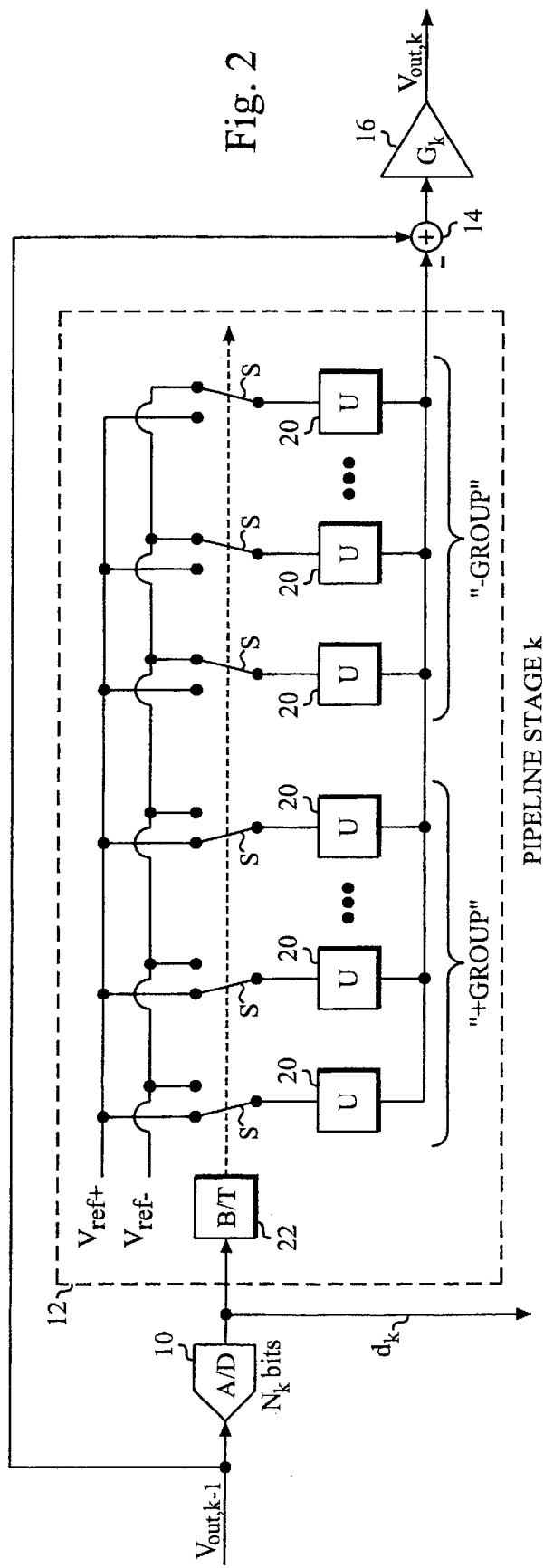
FIG. 2 is a block diagram of a typical pipeline stage of the A/D converter in FIG. 1.

FIG. 2 is a block diagram of a typical pipeline stage k (k=1, 2, ... K) of the A/D converter in FIG. 1. The pipeline stage receives the analog output signal $V_{out,k-1}$ from the previous stage and converts this signal to a digital signal $d_k$ having a resolution of $N_k$ bits in sub A/D converter 10. This digital signal is forwarded to a segmented D/A converter 12. The analog output signal from D/A converter 12 is subtracted from input signal $V_{out,k-1}$ in adder 14, and the resulting analog residual signal is amplified by a gain $G_k$ in amplifier 16 to produce an analog output signal $V_{out,k}$ from stage k. The D/A converter 12 includes a set of unit-segments 20 and switches S. The switches S connect the unit-segments to either $V_{ref+}$ or $V_{ref-}$. In a single-ended implementation $V_{ref+}$ is typically a positive voltage, while $V_{ref-}$ is 0. In a differential embodiment $V_{ref-}$ equals $-V_{ref+}$ if the common-mode voltage is 0. Each unit-segment 20 logically belong to either a "+group" or a "−group", depending on whether the segment is connected to $V_{ref+}$ or $V_{ref-}$. The output signal from D/A converter 12 is changed by changing the state of one or several switches S. The switch states are controlled by the digital signal $d_k$ from A/D converter 10. However, if this signal is in binary format it can not be used directly. In such a case it is first converted to thermometer code in a B/T (Binary-to-Thermometer) converter 22. This thermometer code controls switches S, as indicated by the dashed arrow in FIG. 2. Alternatively, A/D converter 10 may produce a digital signal in thermometer code directly. This is often the case with flash A/D converters.

The above mentioned problems of the prior art are solved by the present innovation by using segment-related calibration coefficients, and a different switching sequence that measures the error of each D/A converter unit-segment independently. This will now be explained in detail.

Figure 3:
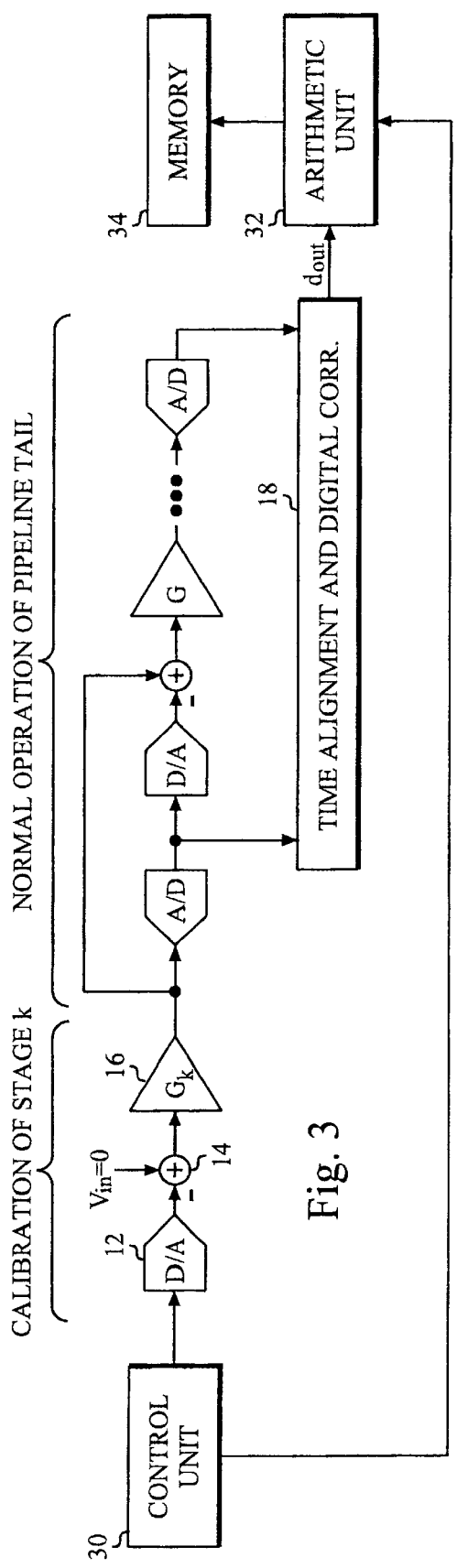
FIG. 3 is a block diagram of an exemplary embodiment of a pipeline A/D converter in accordance with the present invention during the calibration phase.

FIG. 3 is a block diagram of an exemplary embodiment of a pipeline A/D converter in accordance with the present invention during the calibration phase. The output error contributed from each D/A converter unit-segment is estimated using a two-step approach that eliminates the influence of errors associated with other segments. The error is detected by the "tail" of the pipeline A/D converter, which is formed by the remaining stages of the pipeline, as shown in FIG. 3. The tail is used in its normal mode of operation, including time-alignment and digital correction of the "tail" stages in unit 18. Only the stage k being calibrated is switched through a calibration sequence. During calibration a voltage $V_{in}=0$ is forwarded to adder 14 of stage k. The normal signal $d_k$ from A/D converter 10 to D/A converter 12 is replaced by a control signal from a calibration control unit 30. The control signals from calibration control unit 30 control the switches of the unit-segments of D/A converter 12 in a manner that will be further described with reference to FIG. 5. The obtained digital output signals $d_{out}$ are forwarded to an arithmetic unit 32 that calculates a correction for each unit-segment in pipeline stage k. The corrections are stored in a calibration coefficient memory 34. This procedure is repeated for all pipeline stages that are to be calibrated (the last stage, stage K is not calibrated, since it has no D/A converter, and calibration may sometimes be performed only for the stages that produce the most significant bits).

Figure 4:
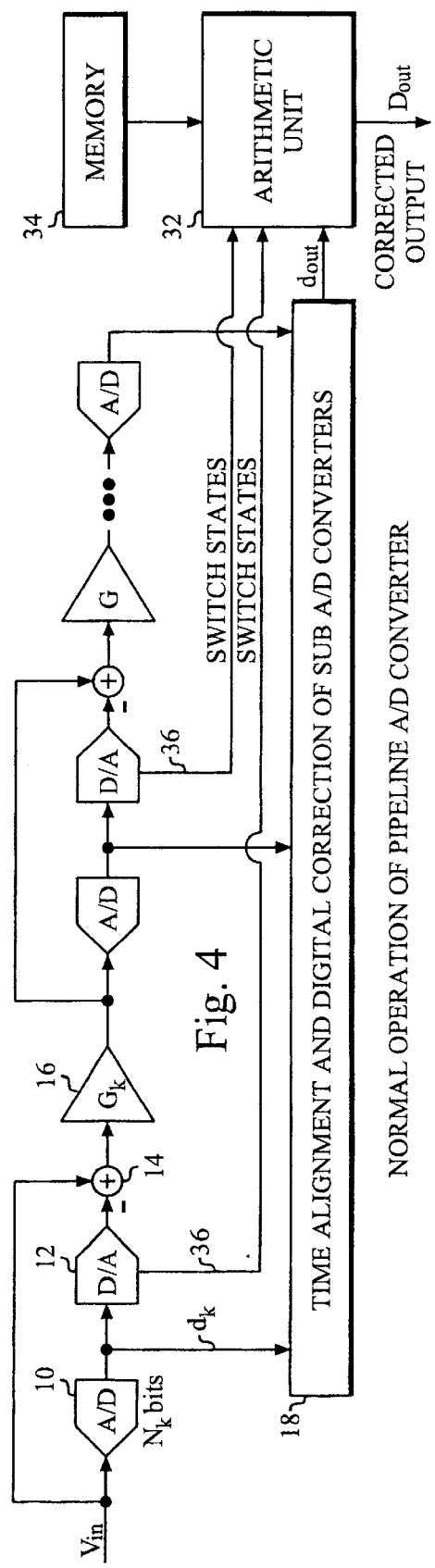
FIG. 4 is a block diagram of an exemplary embodiment of a pipeline A/D converter in accordance with the present invention during normal operation after calibration.

FIG. 4 is a block diagram of an exemplary embodiment of a pipeline A/D converter in accordance with the present invention during normal operation after the unit-segment calibration procedure described above. This embodiment is based on the structure illustrated in FIG. 1. However, the digital output signal $d_{out}$ is corrected with unit-segment calibration coefficients stored in memory 34. Control lines 36 from D/A converters 12 control arithmetic unit 32 to assign polarities (+ or −) to the corrections in accordance with the current switch states of the unit-segments. This step makes the corrections code independent, since each unit segment is corrected in accordance with its current switch state.

The following paragraphs will explain the mathematical background of the present invention in more detail.

FIG. 5 is a block diagram of a generic unit-segment D/A converter. It is implemented with unit-segments $U_i$, where i=1, 2, ..., x and x is the number of unit-segments (Actually a more correct notation would be $U_{i,k}$, $i_k$ and $x_k$, since the pipeline stage k also should be specified. However, in order to simplify the notation the index k has been dropped where this does not lead to any confusion.) Due to manufacturing tolerances, each unit-segment has the actual value (voltage, current, capacitance, etc. depending on the implementation):

$$U_i = U(1+e_i)$$

where U is the nominal unit-segment value of the pipeline stage, and $e_i$ is the relative error of unit-segment i. If there is one unit-segment per quantization level, the nominal weight of each segment is 1 LSB (Least Significant Bit) at $N_k$-bits resolution, where $N_k$ is the resolution of pipeline stage k (all unit segments in a pipeline stage have the same weight). One LSB in stage k has the weight $w_k$ LSB in the final N-bit output of the pipeline A/D converter. This implies that:

$$w_k = 2^{y_k - 1}$$

where $y_k$ is the bit-position {N, N−1, ..., 2, 1} in the final output word. This gives:

$$y_k = N - \sum_{m=1}^{k}(N_m - 1)$$

for a pipeline A/D converter using a 1-bit range-overlap between pipeline stages for correction of bit-level decision. Due to the error $e_i$, the actual weight of each unit-segment becomes:

$$w_{i,k} = w_k(1+e_i)$$

Example: If the pipeline A/D converter has a total resolution of N=14 bits and if the first pipeline stage has a resolution of $N_1=5$ bits, each unit-segment in the first pipeline stage has the nominal weight:

$$w_1 = 2^{14-(5-1)-1} = 512 \text{ LSB}$$

in the 14 bit output word. With a +1% mismatch, the actual weight becomes 512·1.01=517.12 LSB.

The approach used by the present invention is to estimate the error by switching the unit-segment $U_i$ under calibration to its two possible states and compare the difference between the corresponding two digital output signals with the nominal or ideal difference. The unit-segments are grouped into two groups, a "+group" and a "−group" as indicated in FIG. 5. Preferably the number of unit-segments is the same in both groups (not counting unit segment $U_i$). In a first step unit-segment $U_i$ is switched to the "+group" and a corresponding digital output $d_+$ is detected using the pipeline tail. In a second step unit-segment $U_i$ is switched to the "−group", as indicated by the dashed line in switch S of unit-segment i, and a corresponding digital output $d_-$ is detected using the same pipeline tail. The remaining unit-segments in stage k are unchanged during this process. Ideally, the digital outputs should be $+/-\frac{1}{2}w_k$ (all unit-segments in stage k have the same weight), and the ideal or nominal difference should therefor be $w_k$. In reality, however, the digital output values $d_+$ and $d_-$ are functions of the actual value of each unit-segment in the D/A converter. They are also influenced by inter-stage offset and gain errors, so that the digital outputs actually are:

$$d_+ = -Q\{A(U_+ + U_i - U_-)(1+\gamma) + e_{OS}\}$$

$$d_- = -Q\{A(U_- + U_i - U_-)(1+\gamma) + e_{OS}\}$$

where $e_{OS}$ and $\gamma$ represent the accumulated offset and gain errors present in the A/D converter tail, and $U_+$ and $U_-$ represent the sum of the unit-elements in the "+group" and "−group", respectively. The constant A is a scaling factor that maps the component value to a signal value, and $Q\{\cdot\}$ represents the quantization function. By forming the difference $d_- - d_+$, the following expression is obtained:

$$\Delta_i = d_- - d_+ \approx Q\{2A \cdot U_i(1+\gamma)\} + e_Q =$$
$$= Q\{2A \cdot U(1+\gamma)(1+e_i)\} + e_Q =$$
$$= Q\left\{2A \cdot U\left(1 + \underbrace{e_i + \gamma + \gamma e_i}_{e_{TOT}}\right)\right\} + e_Q$$

where $e_Q$ is a residual error from the quantization. This error can be reduced by increasing the resolution of the A/D converter tail seen by stage k. The introduction of $e_{TOT}$ illustrates the fact that the inter-stage gain errors $\gamma$ appears as a component error. This means that the present invention also calibrates gain errors. The digital calibration coefficient associated with the currently calibrated unit-segment $U_i$ becomes:

$$\delta_{i,k} = \Delta_i - w_k$$

This coefficient $\delta_{i,k}$ represents an estimate of the error contribution from the currently calibrated unit-segment $U_i$. It is stored in calibration coefficient memory 34 and is, during normal operation of the pipeline A/D converter, added to or subtracted from the digital output $d_{out}$, depending on whether the unit-segment is connected to $V_{ref+}$ or $V_{ref-}$ (this information is forwarded to arithmetic unit 32 over control lines 36).

The above procedure for calibrating unit-segment $U_i$ is repeated for the other unit-segments in pipeline stage k. During calibration of other unit-segments in stage k, the "+group" and "−group" will not contain the same unit-segments as during calibration of unit segment $U_i$. However, preferably the groups are still balanced, so that they contain at least approximately the same number of unit-segments.

When all the unit-segments of pipeline stage k have been calibrated, the same calibration procedure may be performed for other pipeline stages. In this way it is possible to determine and store an individual calibration coefficient for every unit-segment in each stage of the entire pipeline A/D converter (As noted above, in practice one or several of the last stages may be left without unit-segment calibration, since they have lower weights than the first stages and therefore do not contribute as much as these stages to the total error).

The efficiency of the calibration is limited by the accuracy with which the coefficients can be estimated and combined with the signal. This accuracy is determined by the magnitude of the quantization error $e_Q$ and the internal word-length used by calibration arithmetic unit 32. It is therefore desirable to use a longer pipeline A/D converter word-length internally, since this will further improve the accuracy of the calibration.

When subject to circuit noise, the code levels $d_+$ and $d_-$ may suffer from large sample-to-sample fluctuations, as indicated in FIG. 7. By taking the averages $\bar{d}_+$ and $\bar{d}_-$ of several samples (for example 100–1000 samples), the influence of noise can be reduced.

Figure 8:
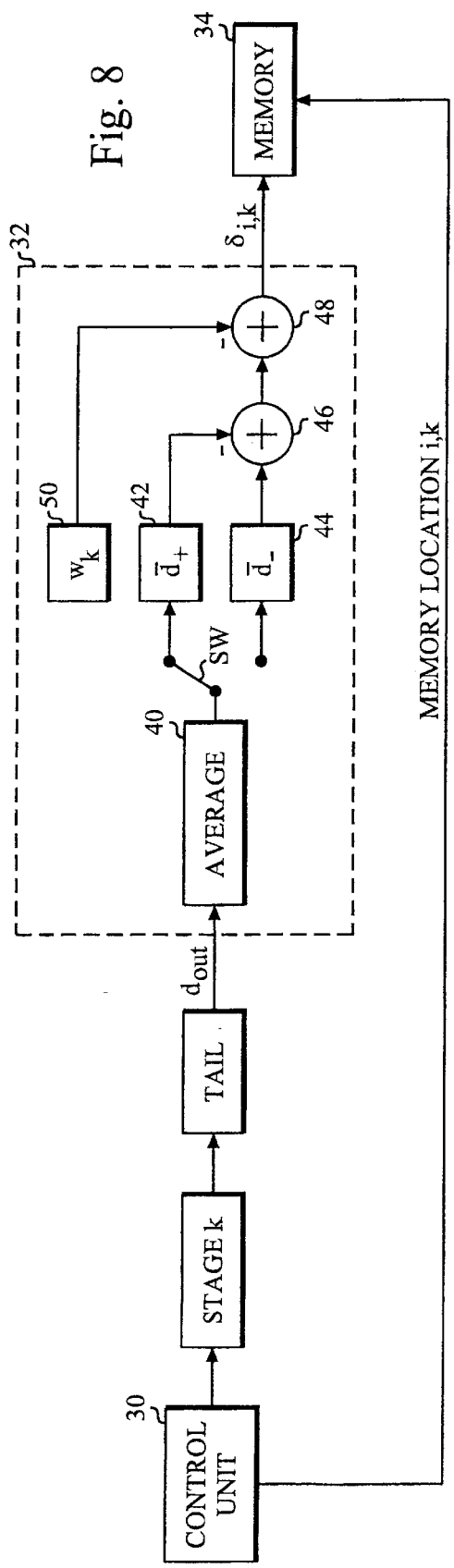
FIG. 8 is a block diagram of an embodiment of a pipeline A/D converter in accordance with the present invention that includes averaging in accordance with FIG. 7.

FIG. 8 is a block diagram of an embodiment that includes averaging in accordance with FIG. 7. In this embodiment arithmetic unit 32 includes an averaging unit 40 forming the average of a predetermined number of samples with the same switch configuration in the pipeline stage under calibration. The output is over a switch SW forwarded to a temporary memory 42 storing the average $\bar{d}_+$. Thereafter the unit-segment i that is to be calibrated is switched to its complementary switch state, and switch SW is switched to its lower position to connect averaging unit 40 to a temporary memory 44 storing the average $\bar{d}_-$. The difference $\bar{d}_- - \bar{d}_+$ is formed in an adder/subtractor 46, and a calibration coefficient is formed by subtracting the expected difference $w_k$ from this difference in an adder/subtractor 48. The resulting calibration coefficient $\delta_{i,k}$ is stored in memory 34. The memory location is determined by control unit 30.

Figure 9:
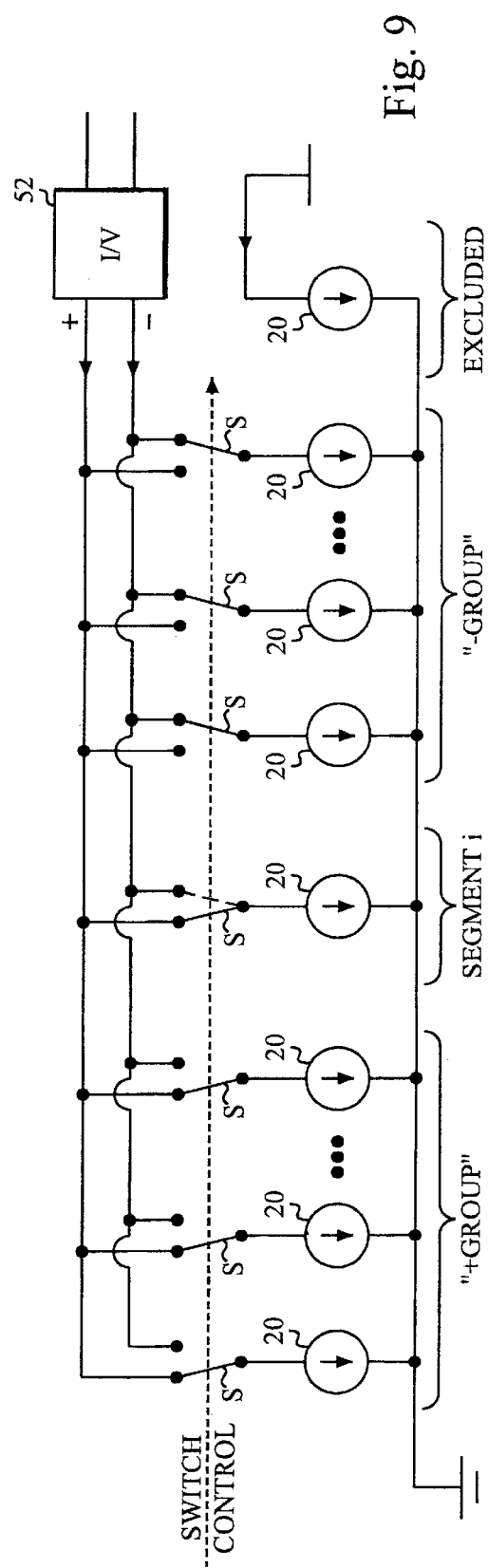
FIG. 9 is a block diagram of a current source implementation of a unit-segment D/A converter during calibration in accordance with the present invention.

FIG. 9 is a block diagram of a current source implementation of a unit-segment D/A converter during calibration in accordance with the present invention. In this embodiment the unit-sources 20 are represented by current sources, and the reference voltages are converted to currents by current/voltage converter 52. If the number of sources is an even number, it is preferable to exclude one of the unit-segments by switching it to a current "dump" node. In this way it is possible to balance the unit-segment groups by using the same number of unit-segments in the "+group" and the "−group". The excluded unit-segment is calibrated in another calibration step, in which another unit-segment is excluded. Preferably the calibration sequence shifts the excluded unit-segment so that each unit segment is excluded once during the calibration of a pipeline stage.

Figure 10:
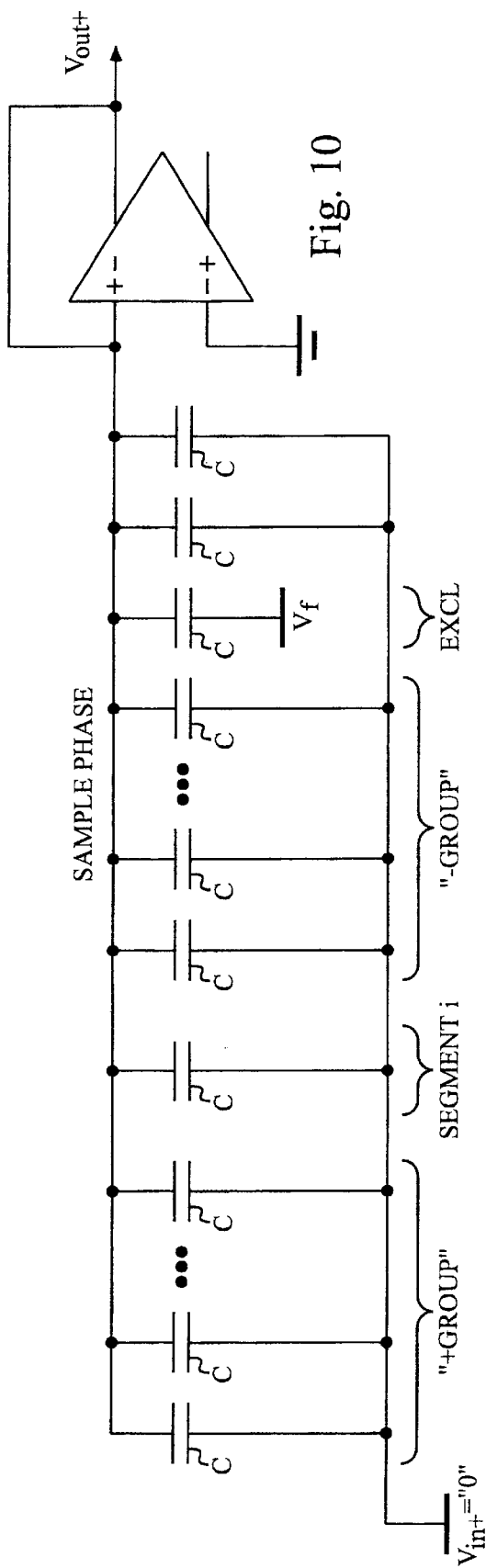
FIG. 10 is a block diagram of a switched-capacitor implementation of a unit-segment D/A converter during the sample phase of the calibration in accordance with the present invention.
Figure 11:
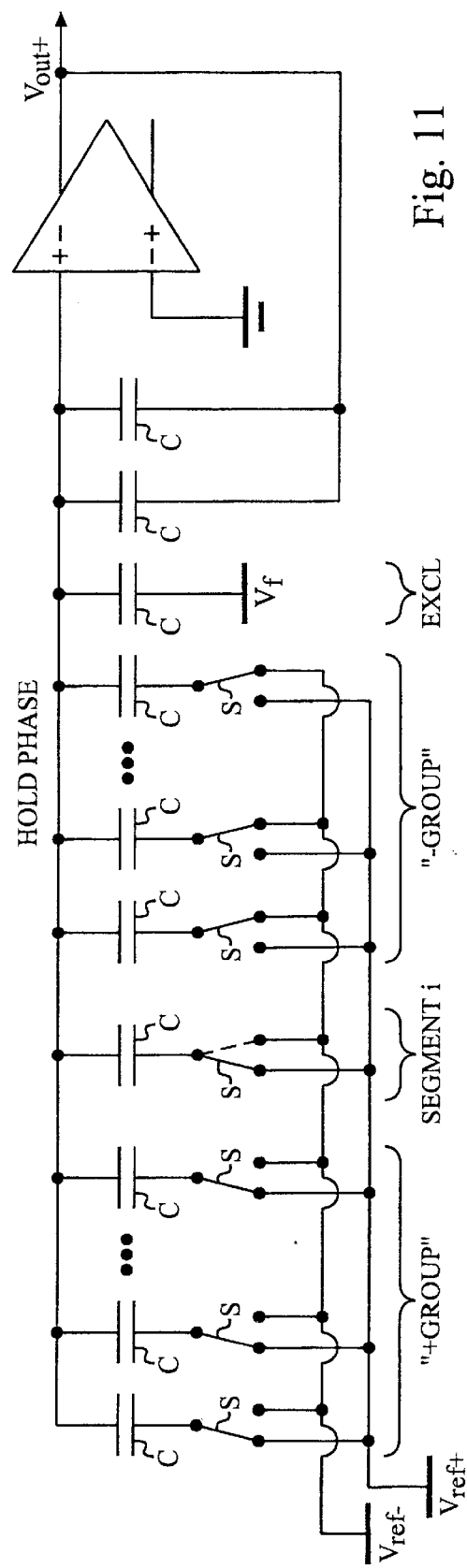
FIG. 11 is a block diagram of a switched-capacitor implementation a unit-segment D/A converter during the hold phase of the calibration in accordance with the present invention.

FIG. 10 is a block diagram of a switched-capacitor implementation of a unit-segment D/A converter during the sample phase of the calibration in accordance with the present invention. In this case the unit-sources 20 are substituted by capacitors C. As in the current source implementation one unit-segment is excluded by switching it to a fixed reference voltage $V_f$ during the calibration of another unit-segment i. It is also noted that two unit-segments are not considered as members of neither the "+group" or the "−group". These segments are used as feedback segments during the hold phase, which is shown in FIG. 11. The number of feedback segments determines the inter-stage gain $G_k$. Here two feedback segments are used. If there is an even number of remaining segments, the groups can still be balanced by excluding one segment.

FIG. 11 is a block diagram of the switched-capacitor implementation in FIG. 10 during the hold phase. During this phase unit-segment i under calibration is switched between its complementary switch states. It is noted that the two capacitors that are not members of the unit-segment groups are connected directly to the output of the stage during this phase (that is why they are not members of the groups). These two capacitors are preferably not shifted through the capacitors of the pipeline stage during calibration.

The data stored in calibration coefficient memory 34 is used to correct the pipeline A/D converter output $d_{out}$ according to the formula (assuming that all unit segments have been calibrated):

$$D_{out} = d_{out} + \delta_{out} = d_{out} + \sum_{k=1}^{K-1} \delta_{out,k}$$

where $\delta_{out}$ is the total correction, $D_{out}$ is the corrected digital output from the pipeline, and $$\delta_{out,k} = \sum_{i=1}^{x_k} \delta_{i,k}(-1)^{s_{i,k}}$$

is the (signal dependent) correction value including the calibration coefficient for each individual unit-segment of pipeline stage k. The D/A converter switch-code value $s_{i,k}$ associated with each switch i in stage k determines whether $\delta_{i,k}$ should be added or subtracted.

Figure 12:
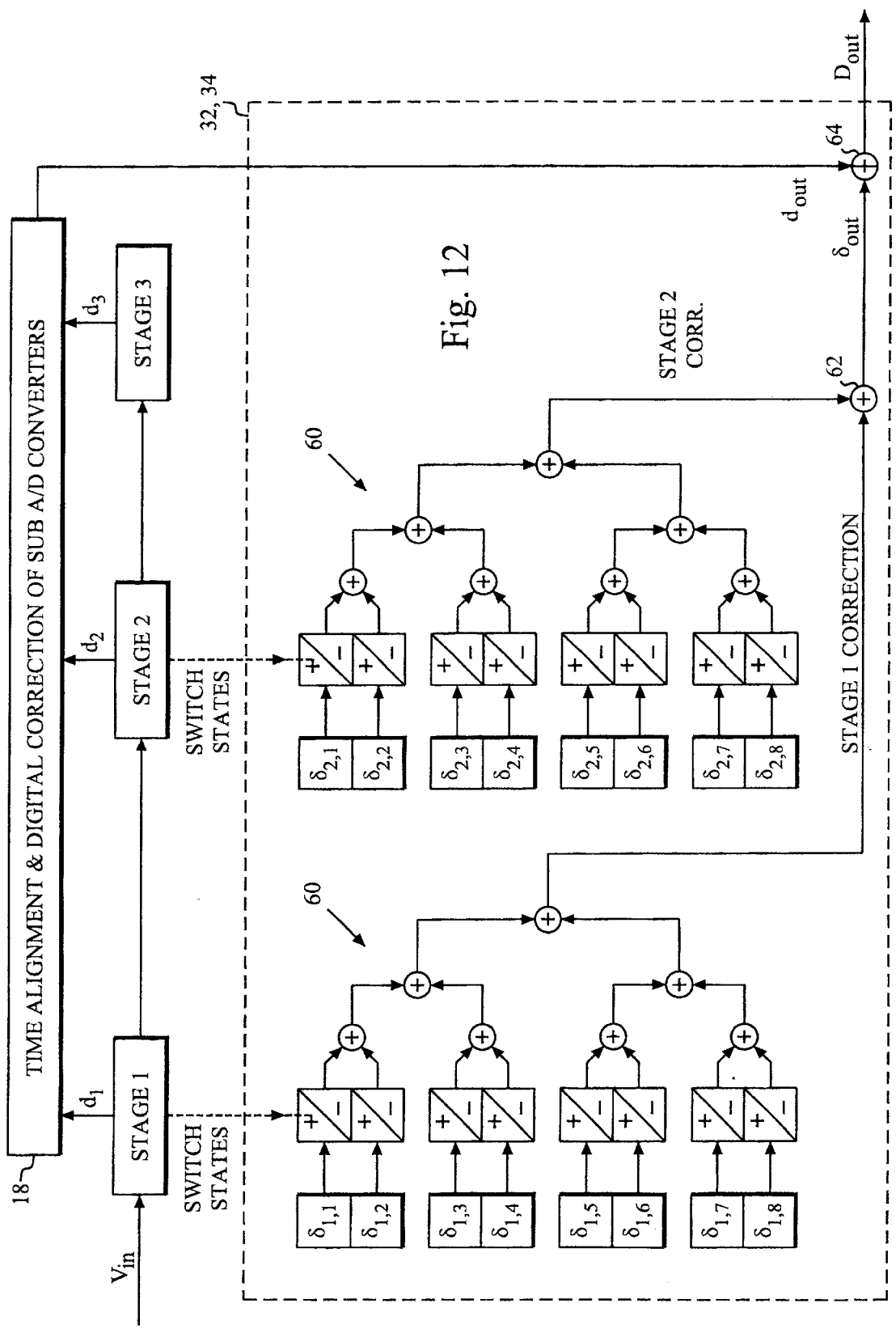
FIG. 12 is a block diagram of an exemplary embodiment of the correction units during normal operation of the calibrated pipeline A/D converter.

FIG. 12 is a block diagram of an exemplary embodiment of the correction units during normal operation of the calibrated pipeline A/D converter. The individual corrections $\delta_{i,k}$ are retrieved from memory 34 and combined with the current switch state to get the correct sign (+ or −). Thereafter the corrections for each stage are added together in an adder network 60 for each calibrated pipeline stage. Thereafter the corrections for each stage are added together in an adder 62 to form the complete correction $\delta_{out}$. Finally this correction is added to the A/D converter output $d_{out}$.

It is to be noted that the switch states may change between samples even if the samples represent the same code (dynamic element matching/scrambling). However, according to an essential feature of the present invention this is acceptable, since the switch states are considered in the actual correction. Thus, in contrast to the prior art, the same code may be associated with different corrections, depending on the switch states of the unit-segments.

Figure 13:
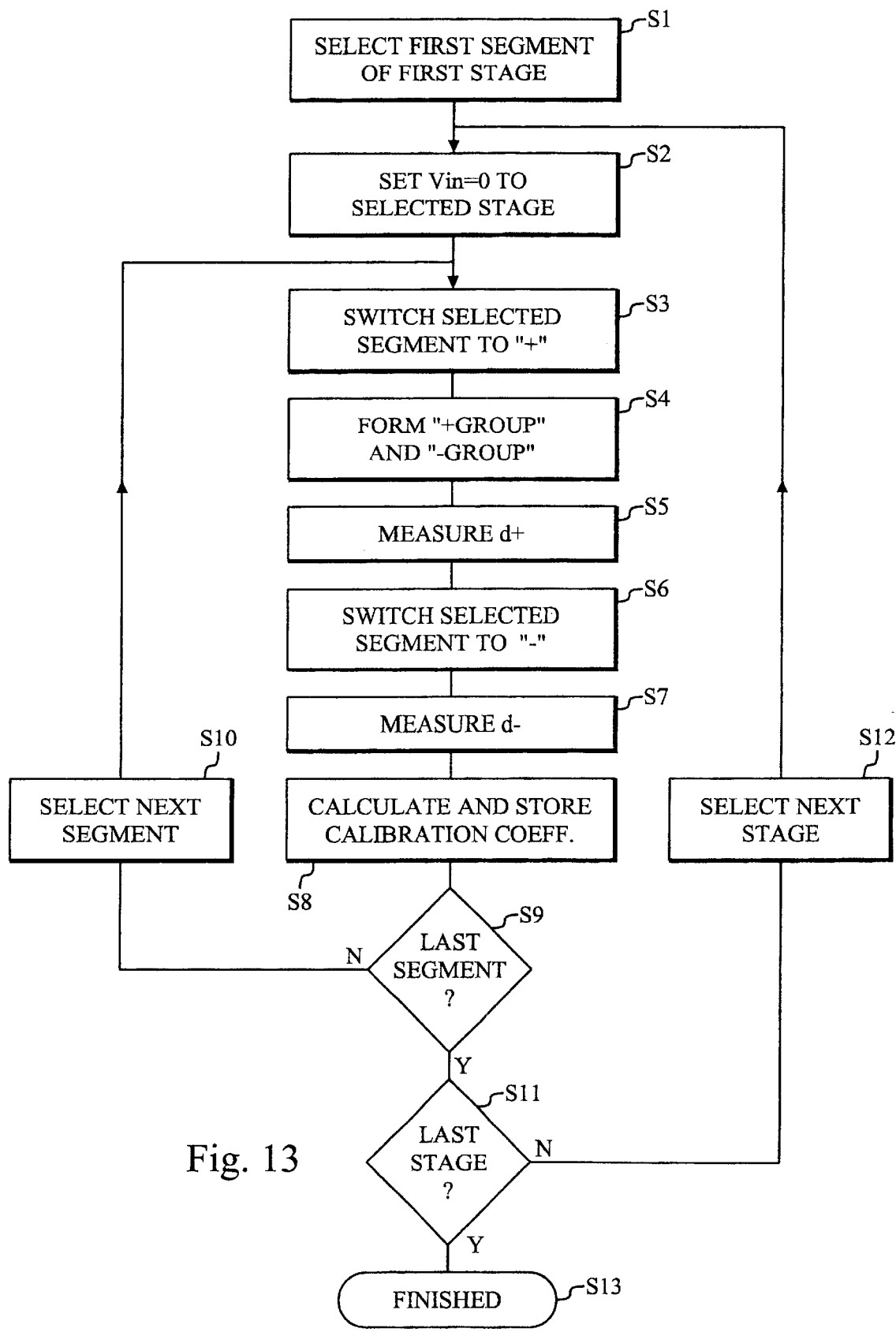
FIG. 13 is an exemplary embodiment of the calibration method in accordance with the present invention.

FIG. 13 is an exemplary embodiment of the calibration and correction method in accordance with the present invention. Step S1 selects the first unit-segment of the first pipeline stage to be calibrated. Step S2 sets the input signal of the selected stage to zero. In step S3 the selected unit-segment is switched to $V_{ref+}$. Step S4 forms the "+group" and "−group" of unit-segments. Thereafter Step S5 measures $d_+$. Step S7 switches the selected segment to $V_{ref-}$. Thereafter Step S7 measures $d_-$. Step S8 calculates and stores the calibration coefficient for the selected unit-segment. Step S9 tests whether this is the last unit segment of the selected stage. If not, step S10 selects the next unit segment and returns to step S3. On the other hand, if it is the last unit-segment of the stage, step S11 tests whether the selected pipeline stage is the last to be calibrated. If not, step S12 selects the next pipeline stage and returns to step S2. Otherwise the calibration of the A/D converter is finished in step S13.

It will be understood by those skilled in the art that various modifications and changes may be made to the present invention without departure from the scope thereof, which is defined by the appended claims.

REFERENCES

[1] S. H. Lewis, and P. R. Gray, "A Pipelined 5-Msample/s 9-bit Analog-to-Digital Converter", IEEE J. Solid-State Circ., pp. 954–961, Vol. SC-22, No. 12, December 1987.
[2] C. S. G. Conroy, D. W. Cline, and P. R. Gray, "An 8-b 85-MS/s ParallePipeline A/D Converter in 1-$\mu$m CMOS", IEEE J. Solid-State Circ., pp. 447–454, Vol. 28, No. 4, April 1993.
[3] I. Galton, and P. Carbone, "A Rigorous Error Analysis of D/A Conversion with Dynamic Element Matching", IEEE Trans. Circ. Syst.- II, pp. 763–772, Vol. 42, No. 12, December 1995.
[4] I. Galton, "Spectral Shaping of Circuit Errors in Digital-to-Analog Converters", IEEE Trans. Circ. Syst.- II, pp. 808–817, Vol. 44, No. 10, Oct. 1997.
[5] EP 0 889 596 A2, Harris Corporation (T.-H. Shu, and G. E. von Dolteren), "Method and apparatus for calibrating integrated circuit analog-to-digital converters".
[6] H.-S. Lee, and D. Hodges, "Self-Calibration Technique for A/D Converters", IEEE Trans. Circ. Syst., pp. 188–190, Vol. CAS-30, No. 3, March 1983.
[7] J. Goes, J. C. Vital, and J. E. Franca, "A CMOS 4-bit MDAC with Self-Calibrated 14-bit Linearity for High-Resolution Pipelined A/D Converters", 1996 Custom Integrated Circ. Conf., pp. 105–108, IEEE.
[8] E. G. Soenen, and R. L. Geiger, "An Architecture and an Algorithm for Fully Digital Correction of Monolithic Pipelined ADC's", IEEE Trans. Circ. Syst.- II, pp. 143–153, Vol. 42, No. 3, March 1995, IEEE.
[9] U.S. Pat. No. 5,196,851, Samsung Electronics Co (inventors: C. B. Patel, and T. Meyer), "Linearizing non-linear analog-to-digital process and circuit".
[10] U.S. Pat. No. 5,594,612, Crystal Semiconductor Corporation (inventor: W. S. Henrion), "Analog-to-digital converter with digital linearity correction".
[11] U.S. Pat. No. 5,361,067, Motorola Inc (inventor: D. T. Pinckley), "Digital linearization calibration for analog-to-digital converter".
[12] EP 0 460 840 A2, General Electric Company (inventor: D. B. Ribner), "Digital error correction system for subranging analog-to-digital converters".
[13] U.S. Pat. No. 5,499,027, Massachusetts Institute of Technology (inventors: A. N. Karanicolas and H.-S. Lee), "Digitally self-calibrating pipeline analog-to-digital converter".
[14] U.S. Pat. No. 5,331,321, Nokia Mobile Phones Ltd (inventor: P. Mannonen), "A/D converter and D/A converter employing a rodix smaller than a two, and calibration thereof".
[15] WO 94/27373, Analog Devices Incorporated (inventor: H.-S. Lee), "Algorithmic A/D converter with digitally calibrated output".
[16] WO 96/15593, National Semiconductor Corporation (inventors: I. E. Opris, and L. D. Lewicki), "Radix 2 architecture and calibration technique for pipelined analog to digital converter".
[17] EP 0 930 715 A2, Texas Instruments Incorporated (inventor: K. Nagaraj), "Digital self-calibration scheme for a pipelined A/D converter".
[18] U.S. Pat. No. 5,870,041, Massachusetts Institute of Technology (inventors: H.-S. Lee and E. Joe), "Analog-to-digital converter with digital compensation".
[19] WO 99/34516, Maxim Integrated Products Inc (inventors: B. J. McCarroll and C. Rahim), "Digital calibration for analog-to-digital converters with implicit gain proration".

What is claimed is:

1. A method of calibrating a pipeline stage in a multi-bit/stage pipeline A/D converter, comprising the steps of:
   switching a set of D/A converter unit-segments in the stage to predetermined states for producing a first digital signal from the A/D converter;
   switching a predetermined unit-segment in the set to its complementary state, keeping the states of the other unit-segments in the set unchanged, for producing a second digital signal from the A/D converter;
   associating the predetermined unit-segment with a calibration coefficient representing the deviation of the difference between the first and second digital signals from an expected difference between the first and second digital signals; and
   repeating the previous steps for each unit-segment that is to be calibrated.

2. The method of claim 1, further comprising the step of dividing the other unit-segments into two groups, namely a first group in which all unit-segments are in a common switch state, and a second group in which all unit-segments are in a switch state complementary to the common state.

3. The method of claim 2, wherein the first and second group include the same number of unit-elements.

4. The method of claim 1, further comprising the step of calibrating a pipeline stage by individually calibrating its unit-segments with their associated calibration coefficients.

5. The method of claim 4, further comprising the step of forming a pipeline stage correction on a sample by sample basis by accumulating the calibration coefficients with signs that depend on the current switch states of the associated unit-segments.

6. The method of claim 1, further comprising the step of averaging each calibration coefficient over several samples.

7. The method of claim 1, further comprising the step of combining calibration with dynamic element matching.

8. An apparatus for calibrating a pipeline stage in a multi-bit/stage pipeline A/D converter, comprising:
   means for switching a set of D/A converter unit-segments in the stage to predetermined states for producing a first digital signal from the A/D converter;

means for switching a predetermined unit-segment in the set to its complementary state, keeping the states of the other unit-segments in the set unchanged, for producing a second digital signal from the A/D converter;

means for associating the predetermined unit-sternest with a calibration coefficient representing the deviation of the difference between the first and second digital signals from an expected difference between the first and second digital signals; and means for repeating the previous steps for each unit-segment that is to be calibrated.

9. The apparatus of claim 8, further comprising means for dividing the other unit-segments into two groups, namely a first group in which all unit-segments are in a common switch state, and a second group in which all unit-segments are in a switch state complementary to the common state.

10. The apparatus of claim 9, further comprising means for including the same number of unit-elements in the first and second group.

11. The apparatus of claim 8, further comprising means for calibrating a pipeline stage by individually calibrating its unit-segments with their associated calibration coefficients.

12. The apparatus of claim 11, further comprising means for forming a pipeline stage correction on a sample by sample basis by accumulating the calibration coefficients with signs that depend on the current switch states of the associated unit-segments.

13. The apparatus of claim 8, further comprising means for averaging each calibration coefficient over several samples.

14. The apparatus of claim 8, further comprising means for combining calibration with dynamic element matching.

* * * * *